(12) United States Patent
Nagel et al.

(10) Patent No.: US 7,009,853 B2
(45) Date of Patent: Mar. 7, 2006

(54) SWITCHED-MODE POWER SUPPLY ARRANGEMENT

(75) Inventors: Andreas Nagel, Halver (DE); Jochen Mast, Heidelberg (DE)

(73) Assignee: ABB Patent GmbH, Ladenburg (DE)

( * ) Notice: Subject to any disclaimer, the term of this patent is extended or adjusted under 35 U.S.C. 154(b) by 0 days.

(21) Appl. No.: 10/969,431

(22) Filed: Oct. 21, 2004

(65) Prior Publication Data

US 2005/0122746 A1 Jun. 9, 2005

Related U.S. Application Data

(63) Continuation of application No. PCT/EP03/03888, filed on Apr. 15, 2003.

(30) Foreign Application Priority Data

Apr. 25, 2002 (DE) .............................. 102 18 456

(51) Int. Cl.
*H02M 3/335* (2006.01)
*G05F 1/40* (2006.01)

(52) U.S. Cl. ........................ 363/17; 363/67; 323/271
(58) Field of Classification Search ............... 363/65, 363/67, 68, 71, 123, 131, 17; 323/271
See application file for complete search history.

(56) References Cited

U.S. PATENT DOCUMENTS

| | | | |
|---|---|---|---|
| 3,568,035 A | 3/1971 | Pierson | |
| 3,654,542 A | 4/1972 | Chaupit | |
| 4,370,607 A | 1/1983 | Dassonville | |
| 4,631,654 A * | 12/1986 | Houee et al. | ............ 363/21.07 |
| 4,695,935 A * | 9/1987 | Oen et al. | .................. 363/21.1 |
| 5,023,768 A | 6/1991 | Collier | |
| 5,126,930 A * | 6/1992 | Ahn | ........................ 363/21.05 |
| 5,210,780 A | 5/1993 | Schweighofer et al. | |
| 5,434,700 A * | 7/1995 | Yoo | ........................... 359/332 |
| 5,835,367 A | 11/1998 | Pan et al. | |
| 6,151,224 A * | 11/2000 | Lim et al. | ................ 363/21.12 |
| 6,297,616 B1 | 10/2001 | Kubo et al. | |
| 2002/0149954 A1 | 10/2002 | Besnier et al. | |

FOREIGN PATENT DOCUMENTS

| | | |
|---|---|---|
| EP | 0 740 388 | 10/1996 |
| EP | 1 020 973 | 7/2000 |
| FR | 2 808 629 | 11/2001 |
| GB | 2 045 012 | 10/1980 |
| JP | 08 316809 | 11/1996 |
| JP | 11 055097 | 2/1999 |

(Continued)

*Primary Examiner*—Adolf Berhane
(74) *Attorney, Agent, or Firm*—Buchanan Ingersoll PC

(57) ABSTRACT

Exemplary embodiments of the invention relate to a switched-mode power supply arrangement containing two or more switched-mode power supply transformers (T1 to TN), the primary windings (P1 to PN) of the switched-mode power supply transformers (T1 to TN) being connected electrically in series, an output voltage regulator (AR1 to AR2) being connected to each of the secondary windings (S1 to SN) of the switched-mode power supply transformers (T1 to TN), and the series circuit comprising the primary windings (P1 to PN) being connected to the output of an AC source (WQ). The switched-mode power supply transformers (T1 to TN) can include a ferrite toroidal core (RK1 to RKN), which bears the respective secondary winding (S1 to SN), the series circuit comprising the primary windings (P1 to PN) being in the form of a high voltage-isolated conductor loop (SL) passing through all of the ferrite toroidal cores (RK1 to RKN).

3 Claims, 3 Drawing Sheets

FOREIGN PATENT DOCUMENTS

| | | |
|---|---|---|
| SU | 266 037 | 7/1985 |
| WO | 01 52415 | 7/2001 |
| WO | 01 79019 | 10/2001 |
| WO | 02 059628 | 8/2002 |

* cited by examiner

SWITCHED-MODE POWER SUPPLY ARRANGEMENT

RELATED APPLICATIONS

This application is a continuation of PCT International Application No. PCT/EP03/03888 filed in the German language on 15 Apr. 2003, which claims priority from DE 102 18 456.9 filed on 25 Apr. 2002 in the German Patent Office.

FIELD

The invention relates to a potential-isolated power supply for gate units, for example a power supply for gate units for controlling power semiconductor switches in high-voltage switches or converters, in which two or more semiconductor switches are connected in series.

BACKGROUND

In such high-voltage arrangements, the typically used semiconductor switches, which are connected electrically in series, are IGCTs, GTOs, thyristors, MOSFETs and IGBTs, potential isolation being required for supplying power to the gate units in the case of large voltage differences.

Such a potential-isolated power supply for gate units is proposed in WO 02/059628 A.

It is known from the prior art to supply the gate units using respective individual power-supply devices having high potential isolation, either a) by means of highly isolating transformers, connected in parallel with a low-voltage AC bus, usually using 50 Hz technology, or b) by means of separate, highly isolating DC/DC converters, which are connected to a DC voltage supply and are connected in parallel on the input voltage side.

Disadvantages of the known arrangements are, in the case of variant a), the fact that transformers using typical 50 Hz technology are bulky, heavy and expensive, and involve considerable assembly complexity.

In the case of variants a) and b), there are problems with isolation/creepage paths, since the AC or DC power supply bus must run up to each switch stage and be tapped there.

In high-power converter technology, in particular if a series circuit comprising line switching elements is used, increased demands are placed on the isolation of the transformers used in the respective gate control systems and, in particular, also on their parasitic, capacitive coupling between the primary and secondary circuits. This coupling must necessarily be very low in order to prevent the electronic system from having any influence on the gate units owing to charge/discharge currents of the parasitic coupling capacitances. According to the prior art, encapsulated transformers are therefore used to meet the demands placed on isolation. However, these generally have an undesirably high parasitic coupling capacitance, in particular when using transformers based on 50 Hz technology.

SUMMARY

In an exemplary embodiment of the invention, a potential-isolated power supply for gate units, i.e., n arrangement which is suitable for supplying power to loads which are at a different high-voltage potential and by means of which it is possible to meet the stringent requirements both for potential isolation and for a small coupling capacitance.

In an exemplary embodiment of the invention, a potential-isolated power supply for gate units of a high-voltage converter or high-voltage switch, includes a) a plurality of power semiconductor switches connected in series, b) for each gate unit, a switched-mode power supply transformer for supplying power to the gate unit, the switched-mode power supply transformer including a primary winding, a secondary winding, and a ferrite toroidal core which bears the secondary winding, c) a series circuit including the primary windings of the switched-mode power supply transformers, wherein the series circuit is connected to the output of an AC source and is provided in the form of a high voltage-isolated conductor loop which passes through all of the ferrite toroidal cores of the switched-mode power supply transformers, and d) for each switched-mode power supply transformer, an output voltage regulator connected to the secondary winding of the switched-mode power supply transformer. The output voltage regulator includes a rectifier connected to the secondary winding, and a single-pole electronic changeover switch that is connected downstream of the rectifier and controlled by means of a voltage regulator, wherein the single-pole electronic changeover switch connects an output of the rectifier to a respective output capacitor or short-circuits the rectifier output.

An exemplary embodiment of the invention includes two or more switched-mode power supply transformers, wherein the primary windings of the switched-mode power supply transformers are connected electrically in series. An output voltage regulator is connected to each of the secondary windings of the switched-mode power supply transformers. The series circuit comprising the primary windings is connected to the output of an AC source.

In an exemplary embodiment of the invention, the switched-mode power supply transformers each contain a ferrite toroidal core, which bears the respective secondary winding. The series circuit comprising the primary windings is in the form of a high voltage-isolated conductor loop which is passed through all of the ferrite toroidal cores.

The low complexity required for implementing the switched-mode power supply arrangement in accordance with exemplary embodiments of the invention, is advantageous. As a result, the switched-mode power supply arrangement is particularly suitable for use in high-voltage converters having a large number of individual elements connected in series, since the number of components associated with the individual gate units in the switched-mode power supply arrangement is minimal. The transformers are small in volume and can be mounted directly on the conventional printed circuit board of the gate units.

One of the advantages is furthermore that problems with creepage paths do not occur, since the primary circuit does not need to be broken and tapped. A particularly favorable embodiment of the primary circuit and of the transformers makes it possible also to achieve a very low parasitic coupling capacitance.

Stabilized, positive and negative voltages are generally required to supply power to drive circuits. With the proposed arrangement, it is possible to produce such supply voltages in a particularly simple manner. The specified regulation which in principle has no losses also makes it easily possible to transform relatively high powers of a few 100 W per transformer. It is also possible to produce output voltages of different levels by varying the number of turns, or by using additional windings, on the secondary side.

BRIEF DESCRIPTION OF THE DRAWING FIGURES

The accompanying drawings provide visual representations which will be used to more fully describe the representative embodiments disclosed herein and can be used by those skilled in the art to better understand them and their inherent advantages. In these drawings, like reference numerals identify corresponding elements and:

DETAILED DESCRIPTION

Figure 1:
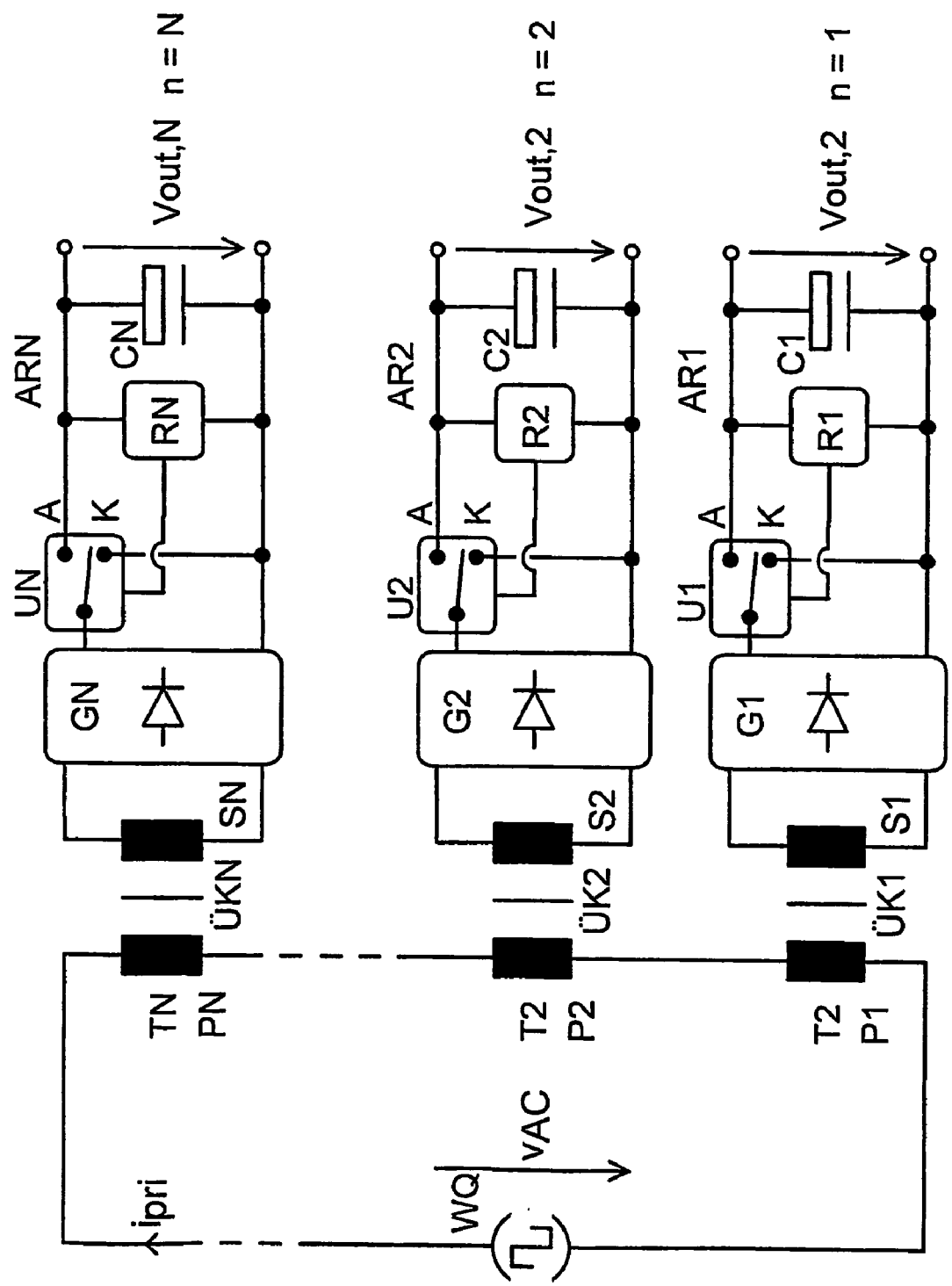
FIG. 1 shows a circuit diagram of an exemplary switched-mode power supply arrangement.

FIG. 1 shows a circuit diagram of an exemplary switched-mode power supply arrangement. The arrangement contains two or more switched-mode power supply transformers T1, T2, to TN, each having primary windings P1, P2 to PN, secondary windings S1, S2 to SN and transformer cores ÜK1, ÜK2 to ÜKN. A series circuit comprising the primary windings P1, P2 to PN forms a primary circuit, in which a primary current $i_{pri}$ flows, which is supplied by an AC source WQ having the AC voltage $V_{AC}$. The current supplied may be a square-wave current, for example, but may also have a different current waveform, for example a sinusoidal waveform.

As shown in FIG. 1, a rectifier G1, G2 to GN is connected to each of the secondary windings S1, S2 to SN, and a single-pole, electronic changeover switch U1, U2 to UN is connected downstream of each of these rectifiers G1, G2 to GN. By means of the changeover switch U1, U2 to UN, the rectifier output, controlled by a respective regulator R1, R2 to RN, is either (in a switch position A) in each case connected to a respective output capacitor C1, C2 to CN, or else (in a switch position K) is short circuited. The secondary-side arrangements each form output voltage regulators AR1, AR2 to ARN.

Using the device illustrated, the respectively required power can be tapped at each of the stages 1 to N, that is to say by means of the output voltage regulators AR1, AR2 to ARN. By way of example, an extreme case of different output powers is described in relation to this: It is assumed here that the full power is required only at a single stage, for example stage 1, and all other stages are on no load. The changeover switches U2 to UN in the stages 2 to N will then for the majority of the time be in position "K", whereas those in stage 1 having a high power requirement will be in position "A". The amplitude of the voltage across the AC source WQ will in this case be $$V_{AC} = \frac{1}{\ddot{u}} Vout, 1$$

This means that, when the components are considered to have no losses, the power supplied by the source WQ is exactly the same value as the power emitted at the output of stage 1. In the equation above, ü refers to the transformer turns ratio; Vout,1 is the output voltage at the output voltage regulator AR1.

In addition to the abovementioned advantages, exemplary embodiments of the invention have very high inherent robustness.

The possible magnetic saturation of the transformer cores ÜK1, ÜK2 to ÜKN has no influence on the operation or the operational reliability of the arrangement. Saturation can occur when the AC source WQ or the rectifiers G1, G2 to GN and the changeover switches U1, U2 to UN have a performance which is not ideal, which is in practice often the case. Therefore, should one or more of the transformers T1, T2 to TN become saturated during the positive half-cycle of the primary current $i_{pri}$, the voltage across these transformers fails. The effect is therefore the same as when the switches S1 to SN are in the position "K", which corresponds to a normal operating condition.

Should a fault occur on one or more of the secondaries, the remaining stages continue to be supplied with power without problems, and remain fully functional. In this case it is irrelevant whether the fault leads to a short circuit, no-load operation or any on-load state:

a) The possible extreme case "short circuit" corresponds to the normal operating state when the changeover switch Sx is in position "K".

b) The other possible extreme case arises when the fault results in no-load operation at the transformer output. This is not a problem either, since the transformer core of the affected stage becomes saturated only during each half-cycle of $i_{pri}$. The supply of power to the other stages remains unimpaired. This is because the off-load transformer has a high impedance on the primary side. The voltage across the source WQ is therefore very high for a short period of time, with the result that the affected core becomes saturated after a very short period of time. For the majority of the switching period, normal operation is thus ensured for the remaining intact stages.

It is possible in a particularly simple manner to produce two or more positive or negative output voltages by fitting additional windings to the individual transformers. Owing to the fact that the output capacitors Cx in position "A" of the changeover switch Sx are connected directly to the transformer Tx, they are effectively connected in parallel. In this case, one voltage regulator Rx and one changeover switch Ux are required only on a single winding in each transformer Tx.

Figure 2:
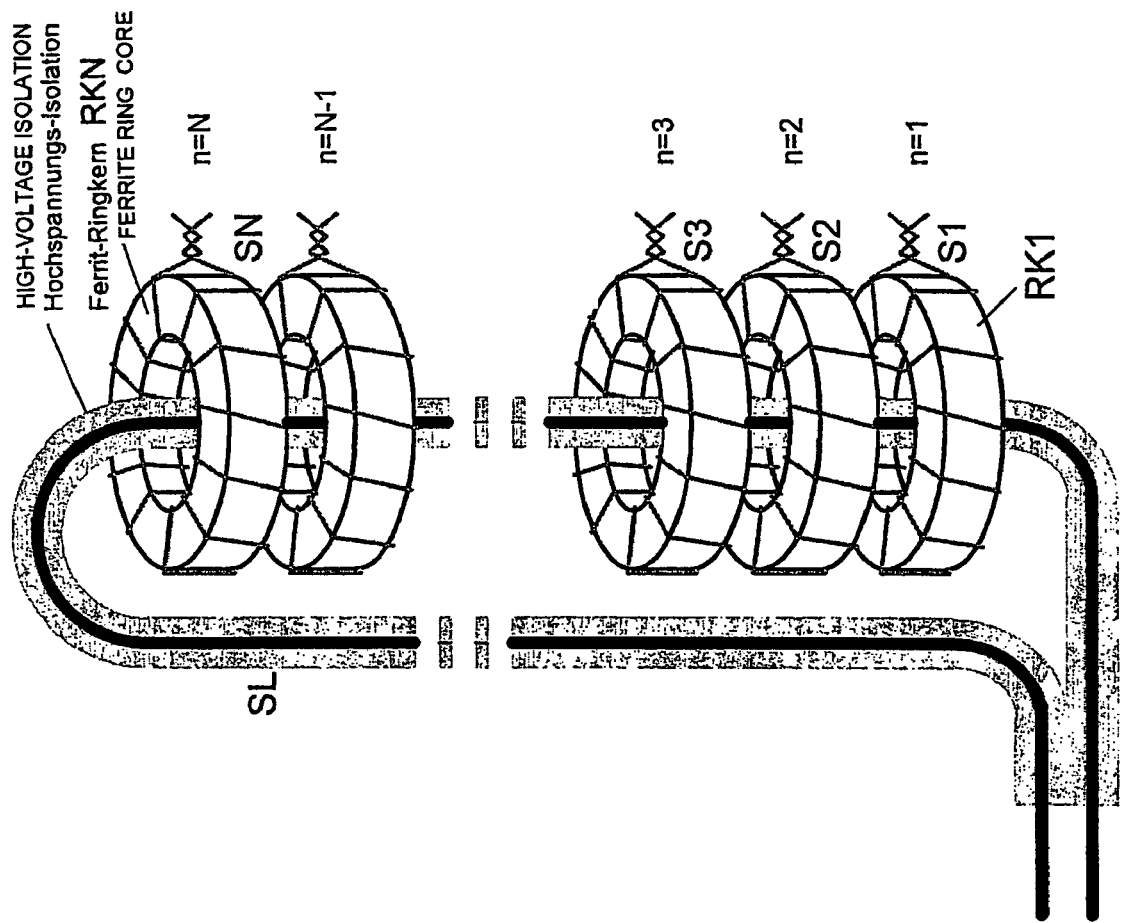
FIG. 2 shows an exemplary arrangement of the switched-mode power supply transformers having toroidal cores and a primary-side conductor loop.

In an exemplary embodiment, the transformers Tx are in the form of a stack, as is illustrated schematically in FIG. 2. In this case, the transformer cores ÜK1, ÜK2 to ÜKN are in the form of ferrite toroidal cores RK1 to RKN, which each bear a secondary winding S1 to SN. The required series circuit comprising primary windings is in the form of a conductor loop SL, which is passed through all of the core openings and is connected by means of an AC source (not shown in FIG. 2). The required potential isolation can be set by means of the toroidal core internal diameter and the isolation characteristics, for example by selecting the material, thickness, and semi-conductive coating for the cable used for forming the primary winding in the form of a conductor loop SL.

Figure 3:
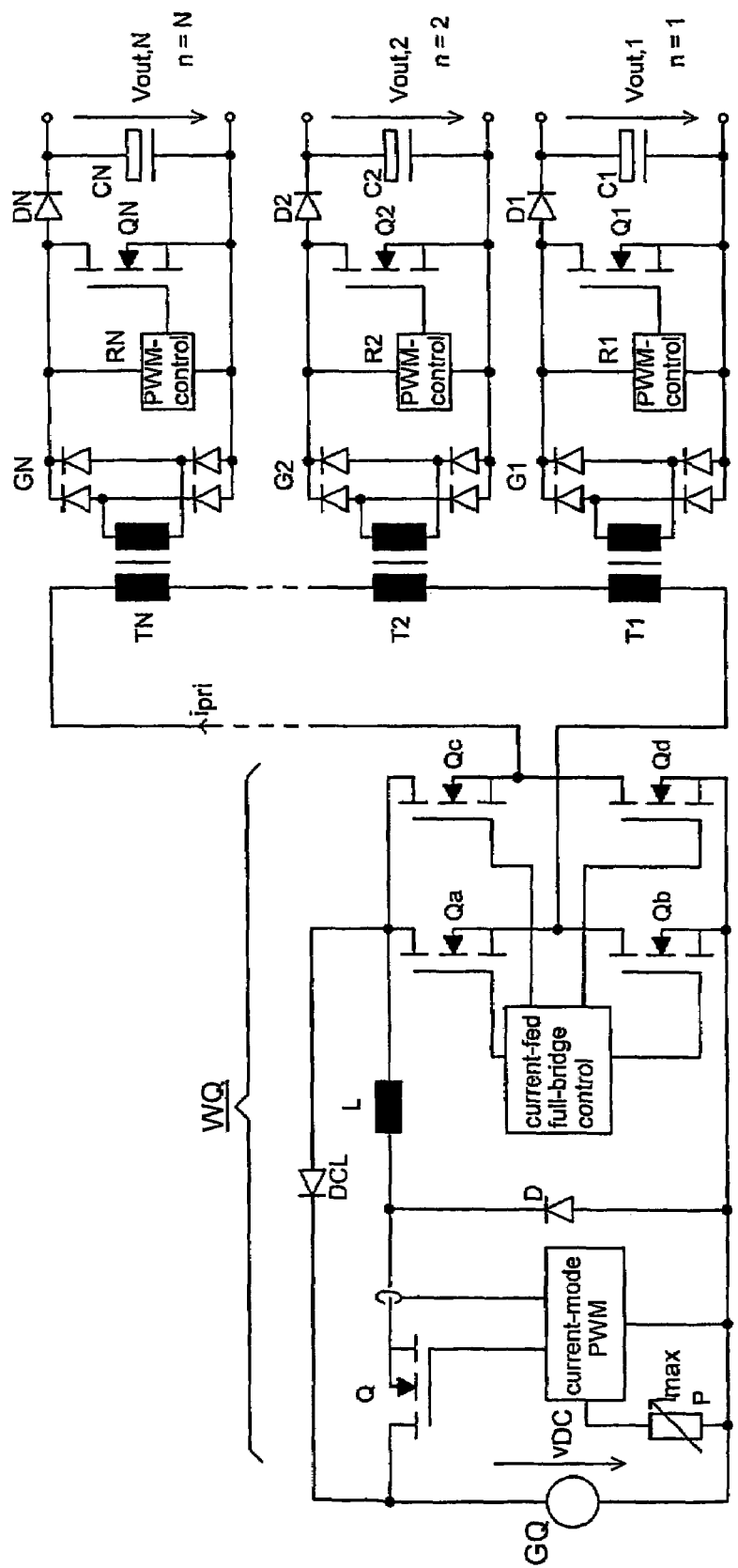
FIG. 3 shows a detail of the circuit of an exemplary switched-mode power supply arrangement.

FIG. 3 illustrates an exemplary embodiment of a switched-mode power supply arrangement. The AC source WQ is in this case in the form of a current-regulated step-down converter. It is also possible, for example, for the switched-mode power supply arrangement to be in the form of a resonant switched-mode power supply. The AC source WQ shown is supplied with power from a DC source GQ (having a DC voltage $V_{DC}$). The AC source WQ contains an electronic switch Q, which is here in the form of a MOSFET, by way of example, as are all other switches in the arrangement. Further elements of the step-down converter are a diode D, an inductor coil L and a PWM regulating system for pulse-width modulated driving of the switch Q, with the desired current value being input, in this case, for example, by means of a potentiometer P. A direct current having a small AC component is thus first generated from the DC input voltage. A downstream H bridge having switches Qa . . . Qd generates from this direct current the alternating current $i_{pri}$ required to be supplied to the primary circuit. The H bridge is controlled such that a current path for the current flowing through the inductor coil L is always provided, i.e. resulting in so-called "overlapping control".

The respective secondary-side, single-pole changeover switches U1 to UN illustrated in FIG. 1, in the arrangement shown in FIG. 3, are in the form of semiconductor switches Q1 to QN, for example in the form of MOSFETs, in conjunction with a diode D1 to DN. The respective rectifier G1 to GN is in the form of a bridge circuit; depending on the requirements, a star circuit may also be used. The secondary-side voltage regulators R1 to RN drive the switches Q1 to QN by means of pulse-width modulation PWM; for example, this PWM may be achieved by means of a two-point controller (hysteresis controller).

It will also be appreciated by those skilled in the art that the present invention can be embodied in other specific forms without departing from the spirit or essential characteristics thereof, and that the invention is not limited to the specific embodiments described herein. The presently disclosed embodiments are therefore considered in all respects to be illustrative and not restrictive. The scope of the invention is indicated by the appended claims rather than the foregoing description, and all changes that come within the meaning and range and equivalents thereof are intended to be embraced therein.

What is claimed is:

1. A potential-isolated power supply for gate units of a high-voltage converter or high-voltage switch, comprising:
   a plurality of power semiconductor switches connected in series;
   for each gate unit, a switched-mode power supply transformer for supplying power to the gate unit, the switched-mode power supply transformer including a primary winding, a secondary winding, and a ferrite toroidal core which bears the secondary winding;
   a series circuit including the primary windings of the switched-mode power supply transformers, wherein the series circuit is connected to the output of an AC source and is provided in the form of a high voltage-isolated conductor loop which passes through all of the ferrite toroidal cores of the switched-mode power supply transformers;
   for each switched-mode power supply transformer, an output voltage regulator connected to the secondary winding of the switched-mode power supply transformer, wherein the output voltage regulator includes a) a rectifier connected to the secondary winding, and b) a single-pole electronic changeover switch that is connected downstream of the rectifier and controlled by means of a voltage regulator, wherein the single-pole electronic changeover switch connects an output of the rectifier to a respective output capacitor or short-circuits the rectifier output.

2. The power supply as claimed in claim 1, wherein at least one of the ferrite toroidal cores bears at least one additional winding.

3. The power supply as claimed in claim 1, wherein the AC source comprises a step-down converter.

* * * * *